United States Patent [19]

Bernier et al.

[11] Patent Number: 4,888,314

[45] Date of Patent: Dec. 19, 1989

[54] LOW-TEMPERATURE SINTERABLE CORDIERITE TYPE CERAMIC POWDER, PREPARATION PROCESS AND CERAMIC COMPOSITION PRODUCED BY SINTERING THIS POWDER

[75] Inventors: Jean-Claude Bernier, Lingolsheim; Paul J. L. Poix, Lingolsheim; Jean-Luc Rehspringer, Griesheim Pres Molsheim; Gabriel G. J. Vilmin, Strasbourg; Serge Vilminot, Strasbourg, all of France

[73] Assignee: Center National De La Recherche Scientifique (C.N.R.S.), Paris, France

[21] Appl. No.: 884,538

[22] Filed: Jul. 11, 1986

[30] Foreign Application Priority Data

Jul. 16, 1985 [FR] France ............................... 85 10873

[51] Int. Cl.$^4$ ............................................. C04B 35/02
[52] U.S. Cl. ........................................ 501/119; 501/9; 501/12
[58] Field of Search ..................... 501/9, 12, 109, 119, 501/120

[56] References Cited

U.S. PATENT DOCUMENTS 4,367,292 1/1983 Sano et al. ........................... 501/119
4,608,215 8/1986 Goaczy et al. ........................ 501/12

FOREIGN PATENT DOCUMENTS 0132740 2/1985 European Pat. Off. .
228803 10/1985 Fed. Rep. of Germany ........ 501/12
2119356 11/1983 United Kingdom .

OTHER PUBLICATIONS

Chem Abst., vol. 102, #14, Abst. 118404N, p. 311, 4/85, Cordierite Sinter Having Low Thermol Expansion Coefficient.
Journal of Non Crystalline Solids, vol. 63, No. 112, 2/1984, Pancrazietol Preparation of Gels in the CaO—Al$_2$O$_3$—SiO$_2$ System from Metal Alkoxides.

*Primary Examiner*—Ferris H. Lander
*Attorney, Agent, or Firm*—Blakely, Sokoloff, Taylor & Zafman

[57] ABSTRACT

The present invention relates to a cordierite (2MgO.- 2Al$_2$O$_3$.5SiO$_2$) type ceramic powder sintering at low-temperature defined in that its composition is: 60 to 50% SiO$_2$, 5 to 20% MgO and 20 to 40% Al$_2$O$_3$, and in that its specific surface area is not less than 50 m$^2$/g, this powder having a fritting temperature of less than 1,100° C.

The invention also relates to a process for the preparation of this powder, which consists in preparing a mixed alcoholic solution of an aluminum and silicon salt, in preparing a solution of an alcohol-soluble magnesium salt, in mixing the two solutions, in padding a hydrolyzing agent in the form of a totally volatile weak base to the solution, which leads to the formation of a gel, in subjecting the said gel to a first thermal treatment at a temperature not exceeding 450° C., and in subjecting the said powder to a second thermal treatment at a temperature of between 450° C. and 900° C.

By a sintering which may be carried out at a temperature lower than 950° C., the powder obtained leads to dielectric ceramics which have a coefficient of expansion less than $1.10^{-6}C^{-1}$, and a dielectric constant less than 5.

25 Claims, No Drawings

LOW-TEMPERATURE SINTERABLE CORDIERITE TYPE CERAMIC POWDER, PREPARATION PROCESS AND CERAMIC COMPOSITION PRODUCED BY SINTERING THIS POWDER

The present invention was made at the Department of Material Sciences of the Ecole Nationale Superieure de Chimie at Strasbourg, Unit No. 440 of the Centre National de la Recherche Scientifique.

It relates to a cordierite ($2MgO.2Al_2O_3.5SiO_2$) type sinterable ceramic powder which has an excellent suitability for fritting, as well as to a process for its preparation.

"Cordierite type" composition will mean a composition falling within the 60 to 50% $SiO_2$, 5 to 20% MgO and 20 to 40% $Al_2O_3$ (here and hereinafter, unless otherwise indicated, all the proportions indicated will be proportions by weight) region of the $SiO_2$—MgO—$Al_2O_3$ ternary diagram.

The invention also relates to novel ceramic compositions produced by sintering the said powders, having a density very close to the theoretical density of cordierite and a low dielectric constant (less than 5).

The use of cordierite-based ceramics in many applications, especially in the manufacture of insulating substrates and supports for integrated circuits, has already been known for many years. These ceramics are prepared by sintering a powder of composition close to cordierite at a temperature of the order of 1,350° C. and after adding sintering agents such as $P_2O_5$. Such ceramics are described, for example, by K. WATANABE and E. GIESS in J. Am. Ceram. Soc. 68 4 C-102-C-103 (1985).

The coidierite type sinterable ceramic powders according to the invention have the advantage over the powders previously used for preparing cordierite-based ceramics, of sintering at much lower temperatures, lower than 1,100° C., and even lower than 950° C., and of not requiring the addition of fritting agents.

This low-temperature sinterable powder is defined by its composition being 60 to 50% $SiO_2$, 5 to 20% MgO and 20 to 40% $Al_2O_3$, and by its specific surface area being not less than 100 m²/g, preferably not less than 250 m²/g, this powder having a sintering temperature of less than 1,100° C.

The process according to the invention is defined in that it consists successively:
in preparing a mixed alcoholic solution of magnesium, aluminum and silicon salts, it being required that the said salts are soluble in alcohol or in a solvent which is miscible with alcohol,
in performing a vigorous stirring in order to obtain a homogeneous solution,
in adding a hydrolyzing agent in the form of a totally volatile weak base to the previous solution, which leads to the formation of a gel,
in treating thermally the gel obtained at a temperature not exceeding 450° C. for a period not exceeding 24 h,
in treating thermally the powder obtained at a temperature of between 450° C. and 900° C. for a period not exceeding 6 h.

Preferably, the stage of the thermal treatment of the powder is preceded by a stage of hydrogen peroxide treatment at a temperature of between 60° C. and 100° C., followed by the filtration of the suspension obtained.

The aluminum is introduced:
either in the form of an alcohol-soluble alkoxide of formula

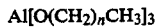

in which n represents an integer of between 0 and 4. Aluminum butoxide of formula

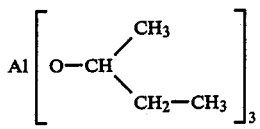

is advantageously used.

However, other alkoxides also lead to good results, such as aluminum ethoxide, propoxide and isopropoxide:
either in the form of organic salts or of organic complexes, such as aluminum acetate, aluminum benzoate, aluminum acetylacetonate, aluminum stearate.

In general, all organic salts or complexes which are soluble in alcohol or soluble in a solvent miscible with alcohol are suitable for the accomplishment of the invention:
or alternatively, in the form of inorganic salts, such as anhydrous or hydrated aluminum nitrate $Al(NO_3)_3$ in an alcoholic solution, aluminum chloride $AlCl_3$ in an alcoholic solution; by boiling this latter solution for a sufficient period, the hydrochloric acid is removed and the corresponding aluminum alkoxide is generated. Hydrated aluminum chloride may also be used.

In general, all aluminum salts which are soluble in alcohol or in a solvent which is miscible with alcohol are suitable for the accomplishment of the invention.

The silicon is introduced:
either in the form of an alcohol-soluble alkoxide of formula

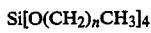

in which n represents an integer of between 0 and 4. Silicon ethoxide of formula

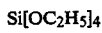

is advantageously used.

However, other silicon alkoxides also lead to good results, such as silicon methoxide, propoxide, isopropoxide and butoxide;
or in the form of esters or salts, such as silicon tetraacetate $Si(CH_3COO)_4$ which is soluble in acetic acid, or a quarternary ammonium silicate.

In general, all esters or salts which are soluble in alcohol or soluble in a solvent which is miscible with alcohol, or in their corresponding acid, are suitable for the accomplishment of the invention.

The magnesium is introduced:
either in the form of an ester or a salt.

Anhydrous or hydrated magnesium acetate $Mg(CH_3COO)_2$ in anhydrous acetic acid is advantageously used.

In the same way, other esters such as magnesium benzoate, propionate, oleate, or stearate may be used.

In general, any magnesium ester or salt which is soluble in alcohol or in a solvent which is miscible with alcohol, or in its corresponding acid is suitable for the accomplishment of the invention:

or in the form of inorganic salts, such as anhydrous or hydrated magnesium chloride or nitrate in an alcoholic solution.

The mixed solution of aluminum, magnesium and silicon salts is prepared in the presence of an alcohol which may be, for example, isopropanol.

The hydrolysis which leads to the gel formation is carried out at a temperature generally of between 20° C. and 80° C., preferably between 20° C. and 50° C., with a weak base, such as hydrated hydrazine $NH_2-NH_2\cdot H_2O$. In general, any weak base which only contains volatile ions, such as diluted ammonia or hydroxylamine, is suitable for the accomplishment of this stage of the process.

However, hydrated hydrazine is preferably used, because the latter performs the role of the complexing agent and regulates the hydrolysis kinetics. This role performed by the hydrated hydrazine on the hydrolysis kinetics is of a very special interest when aluminum and silicon alkoxides and magnesium acetate, which have different hydrolysis kinetics are used as the starting products: aluminum alkoxide is hydrolyzed easily, silicon alkoxide with more difficulty, magnesium acetate dissolves in water.

In this regard, it is appropriate to note that it is desirable that the solution is completely free from water, because the least trace of water would cause an uncontrolled hydrolysis of the most fragile alkoxide, viz. aluminum alkoxide. However, it is noted that if the aluminum alkoxide is replaced by aluminum nitrate, the presence of small quantities of water does not interfere.

The thermal treatment to which the gel is subjected after hydrolysis is carried out at a temperature not exceeding 450° C., generally of between 200° C. and 450° C., for a period not exceeding 24 h, generally between 1 and 2 hours, the rate of increase in temperature being, for example, of between 50° C. and 100° C./h. The aim of this thermal treatment is to remove the major part of the solvents, of water and of hydrazine. At the end of this treatment, the powder obtained has a white, or possibly slightly yellowish color.

If desired, the powder is washed with hydrogen peroxide, preferably concentrated (20-30%), at a temperature of between 60° C. and 100° C. This hydrogen peroxide treatment is aimed at removing the last organic radicals which may be bound to the metals Al, Si or Mg.

It will be noted that this hydrogen peroxide treatment stage may be omitted, if the application for which the powder is intended is not adversely affected by the presence of traces of carbon, resulting from the pyrolysis of organic matter which is not completely removed by calcination during the thermal treatment.

After washing with hydrogen peroxide, the powder is subjected to a further thermal treatment which is carried out at a temperature of between 450° C. and 900° C., generally between 550° C. and 700° C. for a period not exceeding 6 h, generally between 30 and 120 min, in order to remove the water of constitution and of hydration.

The powder obtained by the process according to the invention has a composition close to cordierite ($2MgO\cdot 2Al_2O_3\cdot 5SiO_2$), it being possible for this composition to vary within the limits of the ternary crystallization zone:

(60%-50%) $SiO_2$, (5%-20%) MgO, (20%-40%) $Al_2O_3$

The powder obtained is a relatively coarse powder which, after a light grinding, gives a powder which consists of grains of which the dimensions are of between $0.5\mu$ and $10\mu$, and which is white in color.

The powder according to the invention has a very weakly crystalline glass type of structure and remains amorphous up to a temperature of the order of 800° C.

The powder obtained by the process according to the invention has an excellent suitability for sintering and, in particular, lends itself to sintering at a temperature of less than 950° C. without sintering adjuvants such as $P_2O_5$.

After shaping by pressing or alternatively by cold casting, the powder according to the invention starts to sinter in an amorphous form at 770° C., to reach a predensification level of at least 95% after 15 min at 1,050° C., the increase in temperature between 800° C. and 1,000° C. being carried out at a rate of between 2° C. and 10° C./min.

When the powder is shaped by cold casting, it is advantageously brought into suspension in a solvent such as methylcellulose and then applied in the form of a homogeneous paste on a flat metallic surface and then sintered.

In fact, as regards sintering, it is ascertained that the latter takes place in three stages: sintering in the amorphous form from 770° C.; sintering in the crystallized form from 800° C., the crystallized phase being $\mu$-cordierite; sintering in the crystallized form from 860° C., the crystallized phase being a mixture of $\mu$-cordierite and of $\beta$-cordierite. The complete transformation of $\mu$-cordierite into $\beta$-cordierite may be achieved from 900° C. (the $\mu$-cordierite and $\beta$-cordierite phases were identified by their X-ray diffractogram according to the ASTM leaflets No. 14-249 and 13-293 respectively).

From 800° C., the sintering is accompanied by the crystallization of $\mu$-cordierite or of the mixture $\mu$-cordierite-mullite. The ceramic obtained after the sintering process is the semi-pure $\beta$-form cordierite ($2MgO\cdot 2Al_2O_3\cdot 5SiO_2$) or mixtures of cordierite and mullite ($3Al_2O_3\cdot 2SiO_2$), the mullite which may possibly form being present in a quantity not exceeding 5 to 10%.

It will be noted that the crystallization of cordierite which accompanies the sintering, takes place without a vitrifying agent such as $P_2O_5$, $B_2O_3$.

The ceramics obtained have a dielectric constant of less than 5.

The lowering of the fritting temperature achieved with the powders according to the invention is of great value in many applications, in particular, during the production of multi-layer condensers. The gain in temperature is of the order of 300° C. to 400° C. compared with the cordierite obtained by conventional processes which sinter at a temperature of 1,300° C.-1,350° C. The multi-layer condensers consist of a stacking of dielectric ceramic layers alternating with metallic layers consisting of electrodes which are co-sintered at the same time as the ceramic layers. Considering the high sintering temperature 1,300° C.-1,350° C., only precious metals such as platinum, palladium, silver or gold and their alloys are suitable.

The lowering of the sintering temperature achieved with the powders according to the invention enable these metals to be replaced by inexpensive metals.

In this connection, it should be noted that the powders according to the invention are defined by a very good adhesion of metal inks based on Cu, Cu—Ni, Cu—Cr and inks based on silver ($Pd_{10}Ag_{90}$).

Furthermore, the multi-layer condensers obtained using powders of compositions close to cordierite according to the invention have low dielectric losses and a low change in capacitance in the high frequency region (100 MHz or 10 GHz), the tangent of the loss angle of these condensers is of the order of $15.10^{-4}$ to 1 MHz.

The powder according to the invention may have many other applications. The following may be mentioned among these:

manufacture of insulating substrates and supports for the multi-connection of integrated circuits, protection of metallic surfaces.

By virtue of their excellent suitability for laying, the powders according to the invention brought into suspension in the solvent are applied in the form of a thin layer on the surface to be coated and are then fritted at low-temperature.

Manufacture of porous ceramics.

In this case, the presence of a small quantity of carbon in the powder after thermal treatment is sought. Such a ceramic is obtained by omitting the hydrogen peroxide treatment stage which, as seen earlier, aims at the complete removal of organic radicals which may be bound to the metals Al, Si, Mg.

Manufacture of ceramic fibers which have a very low coefficient of expansion (of the order of $2.10^{-6}C^{-1}$), manufacture of structural ceramics with good thermo-mechanical properties, supports for catalysts.

Other particularities and advantages of the invention will become apparent on reading the examples of implementation given below, in a non-limiting way.

EXAMPLE 1

4.74 g of aluminum butoxide and 4.858 g of silicon ethoxide are dissolved in 30 cc of isopropanol.

1.301 g of magnesium acetate, oven-dried beforehand at a temperature of between 100° and 150° C. are then dissolved in 15 cc of anhydrous acetic acid.

The two solutions are mixed and a clear solution is thus obtained.

A 30-cc volume of hydrazine hydrate is introduced into this solution, with vigorous stirring. A gel is formed which is allowed to stand for a few hours.

The gel is subjected to a thermal treatment with a temperature increase rate of 200° C. to 450° C./h and a plateau of 1 to 3 h at a temperature of 200° C. to 450° C.

The gel is then washed with concentrated hydrogen peroxide. The powder obtained on filtration is heated to 700° C. for ½ to 2 h.

An X-ray analysis shows that this powder has a very weakly crystalline glass type structure. Its composition is that of cordierite ($2MgO.2Al_2O_3.5SiO_2$).

The powder pressed (3 tonnes/cm²) in the form of a parallelepiped shows a start of fritting between 820° C.-830° C., to become complete at 1,050° C. The density obtained is greater than 96% of the theoretical value. The dielectric constant is 4 (by way of indication, the best values obtained so far are not less than 4.9). The coefficient of expansion is of the order of $2.10^{-6}C^{-1}$.

The specific surface area ("BET"), measured for the powder thus obtained is greater than 270 m²/g, which is more than one order of magnitude greater than the values obtained for conventional cordierites, of the order of 10 m²/g.

The X-ray diffractogram obtained for this powder, after thermal treatment for 1 h, remains blank for temperatures ranging from ambient temperature to 800° C., showing the absence of crystalline structure.

The quantitative analysis also shows a purity greater than 99%, that is, a cation (other than Si, Al or Mg) content of less than 1%. The complete absence of $TiO_2$ and $P_2O_5$ may particularly be noted, whereas these oxides are always present, at least in trace amounts, in cordierite powders prepared conventionally by a glass-making method.

The process of crystallization of the amorphous powder may be characterized by a study of the X-ray diffraction at high temperature, between 500° C. and 1,100° C.

This diffractogram, obtained using a powder prepared at 500° C. according to the process described above, shows the appearance, between 780° C. and 830° C., of a crystalline compound of which the X-ray diffraction pattern is characteristic of $\mu$-cordierite, $\beta$-cordierite appears only at 890° C.

EXAMPLE 2

A ceramic is produced using a powder, the magnesium content of which is increased by 10% relative to the stoichiometric value.

To this end, the 1.301 g of magnesium acetate in Example 1 are replaced by 1.430 g of magnesium acetate, the rest of the values remaining unchanged. The conditions of operation are the same as in Example 1.

A start of sintering is observed at 800° C.-850° C. and an end of sintering around 1,050° C.

The ceramic obtained essentially consists of cordierite ($2MgO.2Al_2O_3.5SiO_2$). It has a density of approximately 95% of the theoretical value.

We claim:

1. A process for the preparation of a consisting essentially of cordierite sinterable ceramic powder, which consists successively:

in preparing a mixed alcoholic solution of magnesium, aluminum and silicon salts, it being required that the said salts are soluble in alcohol or in a solvent which is miscible with alcohol, in performing a vigorous stirring in order to obtain a homogeneous solution, in adding a hydrolyzing agent in the form of a totally volatile weak base to the previous solution, which leads to the formation of a gel, in treating thermally the gel obtained at a temperature not exceeding 450° C. for a period not exceeding 24 h which leads to the formation of a powder, in treating thermally the powder obtained at a temperature of between 450° C. and 900° C. for a period not exceeding 6 h.

2. The process as claimed in claim 1, wherein the stage of the thermal treatment of the powder is preceded by a hydrogen peroxide treatment stage at a temperature of between 60° C. and 100° C., followed by filtration of the suspension obtained.

3. The process as claimed in claim 1, wherein the aluminum is introduced in the form of an alcohol-soluble alkoxide of formula $Al[O(CH_2)_nCH_3]_3$ in which n represents an integer of between 0 and 4.

4. The process as claimed in claim 3, wherein the aluminum alkoxide is aluminum butoxide.

5. The process as claimed in claim 1, wherein the aluminum is introduced in the form of organic salts or of organic complexes which are soluble in alcohol or are soluble in a solvent which is miscible with alcohol.

6. The process as claimed in claim 5, wherein the organic salt or the organic complex is chosen from the group consisting of aluminum acetate, benzoate, acetylacetonate, stearate.

7. The process as claimed in claim 1, wherein the aluminum is introduced in the form of inorganic salts which are soluble in alcohol or in a solvent which is miscible with alcohol.

8. The process as claimed in claim 7, wherein the inorganic salts are chosen from the group consisting of anhydrous or hydrated aluminum nitrate, or anhydrous or hydrated aluminum chloride.

9. The process as claimed in claim 1, wherein the silicon is introduced in the form of an alkoxide of formula $$Si[O(CH_2)_nCH_3]_4$$

in which n represents an integer of between 0 and 4.

10. The process as claimed in claim 9, wherein the Silicon alkoxide is silicon ethoxide.

11. The process as claimed in claim 1, wherein the silicon is introduced in the form of esters or salts which are soluble in alcohol or are soluble in a solvent which is miscible with alcohol.

12. The process as claimed in claim 11, wherein the ester is chosen from the group consisting of silicon tetraacetate and quarternary ammonium silicates.

13. The process as claimed in claim 1, wherein the magnesium is introduced in the form of an ester or a salt which is soluble in alcohol or in a solvent which is miscible with alcohol or alternatively, in its corresponding acid.

14. The process as claimed in claim 1, wherein the magnesium is introduced in the form of inorganic salts which are soluble in alcohol or in a solvent which is miscible with alcohol.

15. The process as claimed in claim 14, wherein the inorganic salt consists of anhydrous or hydrated magnesium chloride or nitrate.

16. The process as claimed in claim 1, wherein the mixed solution of aluminum and silicon salts is prepared in the presence of isopropanol.

17. The process as claimed in claim 1, wherein the hydrolysis is carried out at a temperature of between 20° C. and 80° C.

18. A ceramic powder adapted to be sintered into a ceramic composition consisting essentially of cordierite, which is produced by the process as claimed in claim 1.

19. The powder as claimed in claim 18, which has a particle size of between 0.5 and 10μ and which has a very weakly crystalline glass type structure.

20. A cordierite type ceramic composition consisting essentially of corderite, which is produced by sintering a powder as claimed in claim 18.

21. The ceramic composition as claimed in claim 20, wherein the sintering is carried out at a temperature of between 800° C. and 1,050° C., with a rate of increase in temperature of between 2° and 10° C./min and by maintaining at a temperature of the order of 1,000° C. for approximately 15 min.

22. The ceramic composition as claimed in claim 20, of which the composition is that of cordierite ($2MgO.2Al_2O_3.3SiO_2$), of which the density is not less than 95% of the theoretical density and which has a dielectric constant less than 5.

23. The ceramic composition as claimed in claim 21, of which the composition is that of cordierite ($2MgO.2Al_2O_3.3SiO_2$), of which the density is not less that 95% of the theoretical density and which has a dielectric constant less than 5.

24. The ceramic powder as claimed in claim 18, of which the composition is: 60 to 50% $SiO_2$, 5 to 20% MgO and 20 to 40% $Al_2O_3$, and of which the specific surface area is not less than 100 $m^2/g$, this powder having a sintering temperature lower than 1,100 degrees centigrade.

25. The ceramic powder as claimed in claim 24, of which the specific surface area is not less than 250 $m^2/g$.

* * * * *

UNITED STATES PATENT AND TRADEMARK OFFICE
CERTIFICATE OF CORRECTION

PATENT NO. : 4,888,314
DATED : 12/19/89
INVENTOR(S) : Bernier et al.

It is certified that error in the above-identified patent and that said Letters Patent is hereby corrected as shown below:

Title Page,
| | | |
|---|---|---|
| [73] Assignee : | delete "Center" | insert --Centre-- |
| col. 01, line 14 | delete "fritting" | insert --sintering-- |
| col. 01, line 36 | delete "coidierite" | insert --cordierite-- |
| col. 01, line 41 | delete "fritting" | insert --sintering-- |
| col. 04, line 51 | delete "fritting" | insert --sintering-- |
| col. 05, line 20 | delete "fritted" | insert --sintered-- |
| col. 05, line 60 | delete "fritting" | insert --sintering-- |

Signed and Sealed this

Twenty-eighth Day of May, 1991

*Attest:*

HARRY F. MANBECK, JR.

*Attesting Officer*  *Commissioner of Patents and Trademarks*